(12) United States Patent
Kikuchi et al.

(10) Patent No.: US 12,300,516 B2
(45) Date of Patent: May 13, 2025

(54) WAFER CLEANING APPARATUS AND BONDING SYSTEM

(71) Applicant: Yamaha Robotics Holdings Co., Ltd., Tokyo (JP)

(72) Inventors: Hiroshi Kikuchi, Tokyo (JP); Kinn Ri, Tokyo (JP)

(73) Assignee: Yamaha Robotics Holdings Co., Ltd., Tokyo (JP)

( * ) Notice: Subject to any disclaimer, the term of this patent is extended or adjusted under 35 U.S.C. 154(b) by 0 days.

(21) Appl. No.: 18/015,075

(22) PCT Filed: Mar. 30, 2022

(86) PCT No.: PCT/JP2022/016037
§ 371 (c)(1),
(2) Date: Jan. 9, 2023

(87) PCT Pub. No.: WO2023/188121
PCT Pub. Date: Oct. 5, 2023

(65) Prior Publication Data
US 2024/0203758 A1 Jun. 20, 2024

(51) Int. Cl.
*H01L 21/67* (2006.01)
*H01L 21/687* (2006.01)

(52) U.S. Cl.
CPC .. *H01L 21/67028* (2013.01); *H01L 21/67132* (2013.01); *H01L 21/68764* (2013.01)

(58) Field of Classification Search
CPC ........... B08B 1/143; B08B 3/02; B08B 7/035; H01L 21/02; H01L 21/304; H01L 21/52; H01L 21/67; H01L 21/67028; H01L 21/67034; H01L 21/67051; H01L 21/67126; H01L 21/67132; H01L 21/67144; H01L 21/67178; H01L 21/677; H01L 21/67721; H01L 21/67748; H01L 21/67751; H01L 21/68742; H01L 21/68764
USPC ......... 134/32, 61, 63, 26, 34, 133, 198, 200, 134/902; 156/345.21, 345.31, 60, 281, 156/297, 299; 315/111.21; 438/704
See application file for complete search history.

(56) References Cited

U.S. PATENT DOCUMENTS

| 7,651,583 B2 | 1/2010 | Kent et al. |
| 9,153,464 B2 | 10/2015 | Kang et al. |
| 2003/0084918 A1 | 5/2003 | Kim |

(Continued)

FOREIGN PATENT DOCUMENTS

| JP | 2008502135 | 1/2008 |
| JP | 2008518470 | 5/2008 |

(Continued)

OTHER PUBLICATIONS

"International Search Report (Form PCT/ISA/210) of PCT/JP2022/016037", mailed on Jul. 5, 2022, pp. 1-3.

(Continued)

*Primary Examiner* — Philip C Tucker
*Assistant Examiner* — Brian R Slawski
(74) *Attorney, Agent, or Firm* — JCIPRNET

(57) ABSTRACT

A wafer cleaning apparatus for cleaning a surface of a wafer includes: a wet cleaning unit that cleans the surface of the wafer with liquid; and a dry cleaning unit that cleans the surface of the wafer with atmospheric pressure plasma, and the dry cleaning unit is disposed above the wet cleaning unit to overlap the wet cleaning unit.

15 Claims, 11 Drawing Sheets

(56) References Cited

U.S. PATENT DOCUMENTS

| | | |
|---|---|---|
| 2005/0269030 A1 | 12/2005 | Kent et al. |
| 2006/0093787 A1 | 5/2006 | Chen et al. |
| 2010/0055915 A1 | 3/2010 | Kanegae et al. |
| 2015/0243537 A1 | 8/2015 | Chen et al. |

FOREIGN PATENT DOCUMENTS

| | | |
|---|---|---|
| JP | 2012250232 | 12/2012 |
| JP | 5188615 | 4/2013 |
| JP | 2016225522 | 12/2016 |
| JP | 2020155759 | 9/2020 |
| KR | 20060031464 | 4/2006 |
| KR | 20180034218 | 4/2018 |
| KR | 20180058892 | 6/2018 |
| WO | 2006047052 | 5/2006 |
| WO | 2007148470 | 12/2007 |
| WO | 2010021020 | 2/2010 |
| WO | 2021132133 | 7/2021 |

OTHER PUBLICATIONS

"Office Action of Taiwan Counterpart Application", issued on Jan. 4, 2024, with partial English translation thereof, p. 1-p. 14.
Office Action of Taiwan Counterpart Application, with partial English translation thereof, issued on Mar. 28, 2024, pp. 1-12.
"Office Action of Korea Counterpart Application", issued on Sep. 2, 2024, with English translation thereof, p. 1- p. 27.
"Office Action of Taiwan Counterpart Application", issued on Jul. 19, 2024, with partial English translation thereof, p. 1- p. 13.

WAFER CLEANING APPARATUS AND BONDING SYSTEM

CROSS-REFERENCE TO RELATED APPLICATION

This application is a 371 application of the International PCT application serial no. PCT/JP2022/016037, filed on Mar. 30, 2022. The entirety of the above-mentioned patent application is hereby incorporated by reference herein and made a part of this specification.

TECHNICAL FIELD

The present invention relates to the structure of a wafer cleaning apparatus for cleaning the surface of a wafer for semiconductor manufacturing and the structure of a bonding system including the wafer cleaning apparatus.

RELATED ART

When manufacturing semiconductors, it is necessary to clean the surfaces of wafers such as silicon wafers and compound semiconductor wafers. Patent Literature 1 discloses a bonding system that integrates a cleaning apparatus that scrubs and cleans the surfaces of wafers when bonding two wafers, a surface modification apparatus that modifies the surface of the wafer by plasma treatment, a surface hydrophilization treatment apparatus that hydrophilizes the surface of a wafer with pure water, an inspection apparatus, and a bonding apparatus. In the bonding system disclosed in Patent Literature 1, the cleaning apparatus and the surface modification apparatus are disposed side by side in the horizontal direction in the same processing block.

In addition, Patent Literature 2 discloses a plasma generation apparatus that generates plasma for cleaning the surface of a semiconductor circuit. Patent Literature 2 discloses a plasma generation apparatus for generating plasma and ejecting the plasma from the tip of a ceramics tube by generating a discharge in the ceramic tube by applying a high voltage between a negative electrode disposed outside the ceramic tube through which plasma gas flows and a ground electrode disposed inside the ceramic tube.

CITATION LIST

Patent Literature

[Patent Literature 1] Japanese Patent Application Laid-Open No. 2020-155759
[Patent Literature 2] Japanese Granted Patent Publication No. 5188615

SUMMARY

Technical Problem

By the way, in the system described in Patent Literature 1, since the cleaning apparatus and the surface modification apparatus that performs plasma treatment are disposed side by side in the horizontal direction, as the installation area of the entire system becomes large, the wafer transport distance in the cleaning process becomes long, and there is a problem that the processing speed cannot be increased.

Therefore, the disclosure reduces the size and installation area of the wafer cleaning apparatus, and reduces the transport distance of the wafer in the cleaning process to improve the processing speed.

Solution to Problem

A wafer cleaning apparatus according to the disclosure is a wafer cleaning apparatus for cleaning a surface of a wafer. The wafer cleaning apparatus includes: a wet cleaning unit that cleans the surface of the wafer with liquid; and a dry cleaning unit that cleans the surface of the wafer with atmospheric pressure plasma. The dry cleaning unit is disposed above the wet cleaning unit to overlap at least a part of the wet cleaning unit.

In this way, by disposing the dry cleaning unit above the wet cleaning unit to overlap at least a part of the wet cleaning unit, the size and the installation area of the wafer cleaning apparatus may be reduced. In addition, since the transport distance between the dry cleaning unit and the wet cleaning unit is shortened, it is possible to improve the processing speed of the cleaning process.

The wafer cleaning apparatus according to the disclosure may further include a processing stage that holds the wafer on its upper surface and is driven in an up-down direction while holding the wafer. The wet cleaning unit may include a wet cleaning chamber for performing wet cleaning. The dry cleaning unit may include a dry cleaning chamber for performing dry cleaning. The processing stage may move the wafer in the up-down direction between the wet cleaning chamber and the dry cleaning chamber.

In this way, since the wafer may be moved between the wet cleaning chamber and the dry cleaning chamber while being held on the upper surface of the processing stage, the time required for moving the wafer between the wet cleaning chamber and the dry cleaning chamber may be shortened, and the processing speed of the cleaning process may be improved.

The wafer cleaning apparatus according to the disclosure may further include a shutter separating the wet cleaning unit and the dry cleaning unit.

In this way, it is possible to suppress the atmospheric pressure plasma in the dry cleaning unit disposed above the wet cleaning unit from hitting the surface of each equipment disposed in the wet cleaning unit and roughening of the surface of each equipment.

The wafer cleaning apparatus according to the disclosure may further include a horizontal transport unit disposed adjacent to the wet cleaning unit. The horizontal transport unit may include a horizontal transport apparatus for moving the wafer into and out of the wet cleaning chamber.

In this way, it is possible to easily move the wafer into and out of the wet cleaning chamber.

In the wafer cleaning apparatus according to the disclosure, the wet cleaning unit may include: a water nozzle for spraying hydrogen water, ozone water, or pure water onto the surface of the wafer; and a wiping head that moves a wiping member attached to its tip along the surface of the wafer to wipe the surface of the wafer. The processing stage may rotate while holding the wafer to rotate the wafer in the wet cleaning chamber.

In this way, it is possible to remove fine foreign matter adhering to the surface of the wafer.

In the wafer cleaning apparatus according to the disclosure, the wet cleaning unit may include a wet cleaning chamber for performing wet cleaning. The dry cleaning unit may include a dry cleaning chamber for performing dry cleaning. The wafer cleaning apparatus may further include a vertical transport unit that is disposed adjacent to side surfaces of the wet cleaning unit and the dry cleaning unit and extends in an up-down direction across the wet cleaning unit and the dry cleaning unit. The vertical transport unit may include a vertical transport apparatus that moves the wafer into and out of the wet cleaning chamber and the dry cleaning chamber and transports the wafer between the wet cleaning chamber and the dry cleaning chamber.

In this way, since the vertical transport unit for transporting the wafer between the wet cleaning chamber and the dry cleaning chamber is disposed on the side surfaces of the wet cleaning unit and the dry cleaning unit, the time required for moving the wafer between the wet cleaning chamber and the dry cleaning chamber may be shortened, and the processing speed of the cleaning process may be improved.

In the wafer cleaning apparatus according to the disclosure, the wet cleaning unit may include: a water nozzle for spraying hydrogen water, ozone water, or pure water onto the surface of the wafer; a wiping head that moves a wiping member attached to its tip along the surface of the wafer to wipe the surface of the wafer; and a processing stage that holds the wafer on its upper surface and is rotated and driven in the up-down direction while holding the wafer.

In this way, it is possible to remove fine foreign matter adhering to the surface of the wafer.

A bonding system according to the disclosure includes: a bonding apparatus for bonding a semiconductor chip onto a wafer; a cleaning apparatus for cleaning a surface of the wafer or a surface of the semiconductor chip; and a transport apparatus for transporting the wafer or the semiconductor chip. The cleaning apparatus includes: a wet cleaning unit that cleans the surface of the wafer or the surface of the semiconductor chip with liquid; and a dry cleaning unit that cleans the surface of the wafer or the surface of the semiconductor chip with atmospheric pressure plasma. The dry cleaning unit is disposed above the wet cleaning unit to overlap at least a part of the wet cleaning unit. The transport apparatus moves the wafer or the semiconductor chip into and out of the cleaning apparatus, and transports the wafer or the semiconductor chip after cleaning from the cleaning apparatus to the bonding apparatus. The bonding apparatus bonds the semiconductor chip after cleaning onto the wafer after cleaning.

In this way, by disposing the bonding apparatus, the cleaning apparatus, and the transport apparatus integrally, it is possible to shorten the time from cleaning to bonding and manufacture a high-quality semiconductor device.

In the bonding system according to the disclosure, the cleaning apparatus may include a processing stage that holds the wafer or the semiconductor chip on its upper surface and is driven in an up-down direction while holding the wafer or the semiconductor chip. The wet cleaning unit may include a wet cleaning chamber for performing wet cleaning. The dry cleaning unit may include a dry cleaning chamber for performing dry cleaning. The processing stage may move the wafer or the semiconductor chip in the up-down direction between the wet cleaning chamber and the dry cleaning chamber.

In this way, the time required for moving the wafer between the wet cleaning chamber and the dry cleaning chamber may be shortened, and the processing speed of the cleaning process may be improved.

In the bonding system according to the disclosure, the cleaning apparatus may further include a shutter separating the wet cleaning unit and the dry cleaning unit.

In the bonding system according to the disclosure, the cleaning apparatus may further include a horizontal transport unit disposed adjacent to the wet cleaning unit. The horizontal transport unit may include a horizontal transport apparatus for moving the wafer or the semiconductor chip into and out of the wet cleaning chamber. The transport apparatus may transfer the wafer or the semiconductor chip to and from the horizontal transport apparatus.

In this way, the transport apparatus may have a simple configuration.

In the bonding system according to the disclosure, the wet cleaning unit may include a wet cleaning chamber for performing wet cleaning. The dry cleaning unit may include a dry cleaning chamber for performing dry cleaning. The bonding system may further include a vertical transport unit that is disposed adjacent to side surfaces of the wet cleaning unit and the dry cleaning unit and extends in an up-down direction across the wet cleaning unit and the dry cleaning unit. The vertical transport unit may include a vertical transport apparatus that moves the wafer or the semiconductor chip into and out of the wet cleaning chamber and the dry cleaning chamber and transports the wafer or the semiconductor chip between the wet cleaning chamber and the dry cleaning chamber. The transport apparatus may transfer the wafer or the semiconductor chip to and from the vertical transport apparatus.

In this way, the time required for moving the wafer between the wet cleaning chamber and the dry cleaning chamber may be shortened, and the processing speed of the cleaning process may be improved.

In the bonding system according to the disclosure, the semiconductor chip may be attached to an upper surface of a support material. The cleaning apparatus may clean the surface of the semiconductor chip attached to the upper surface of the support material. The transport apparatus may transport the semiconductor chip attached to the upper surface of the support material together with the support material. The bonding apparatus may pick up the semiconductor chip from the support material and bonds it onto the wafer.

In this way, it is possible to supply the wafer after dicing to the bonding system to bond the semiconductor chip onto the wafer.

In the bonding system according to the disclosure, the cleaning apparatus may clean the surface of the semiconductor chip bonded to the upper surface of the wafer. The transport apparatus may transport the wafer with the semiconductor chip bonded to its upper surface. The bonding apparatus may pick up another semiconductor chip from the support material and bonds the another semiconductor chip onto the semiconductor chip already bonded to the upper surface of the wafer.

In this way, when bonding semiconductor chips in multiple stages on the wafer, the semiconductor chips in the upper stage may be bonded without transporting the wafer with the semiconductor chips bonded on its upper surface outside the bonding system; therefore, high-quality bonding may be performed.

In the bonding system according to the disclosure, the support material may be a dicing film, a silicon wafer, a glass plate, or a substrate.

Effects of Invention

According to the disclosure, it is possible to reduce the size and installation area of the wafer cleaning apparatus and to reduce the transport distance of the wafer in the cleaning process to improve the processing speed.

DESCRIPTION OF THE EMBODIMENTS

Figure 1:
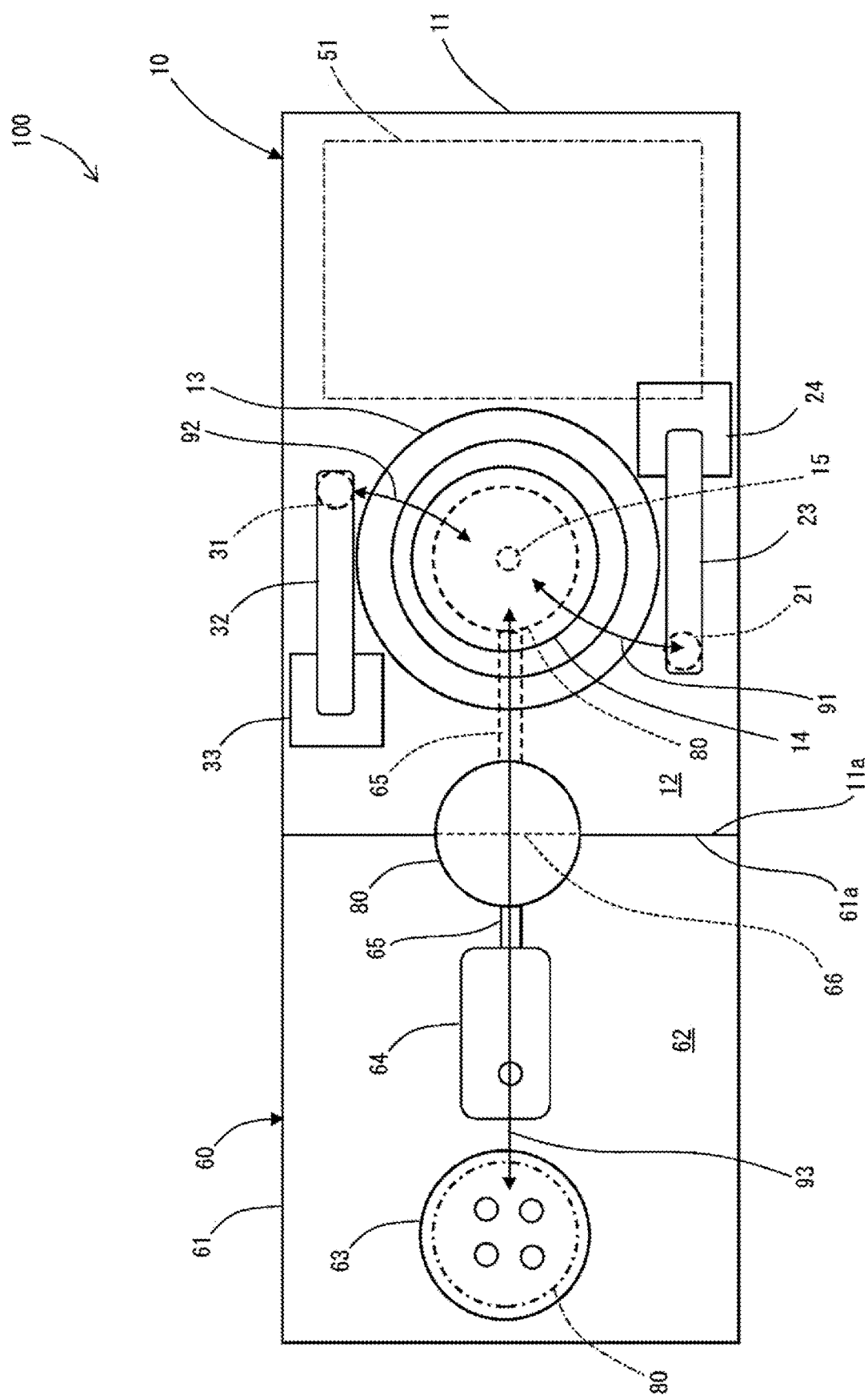
FIG. 1 is a plan view of the first floor of a wafer cleaning apparatus of the embodiment.
Figure 2:
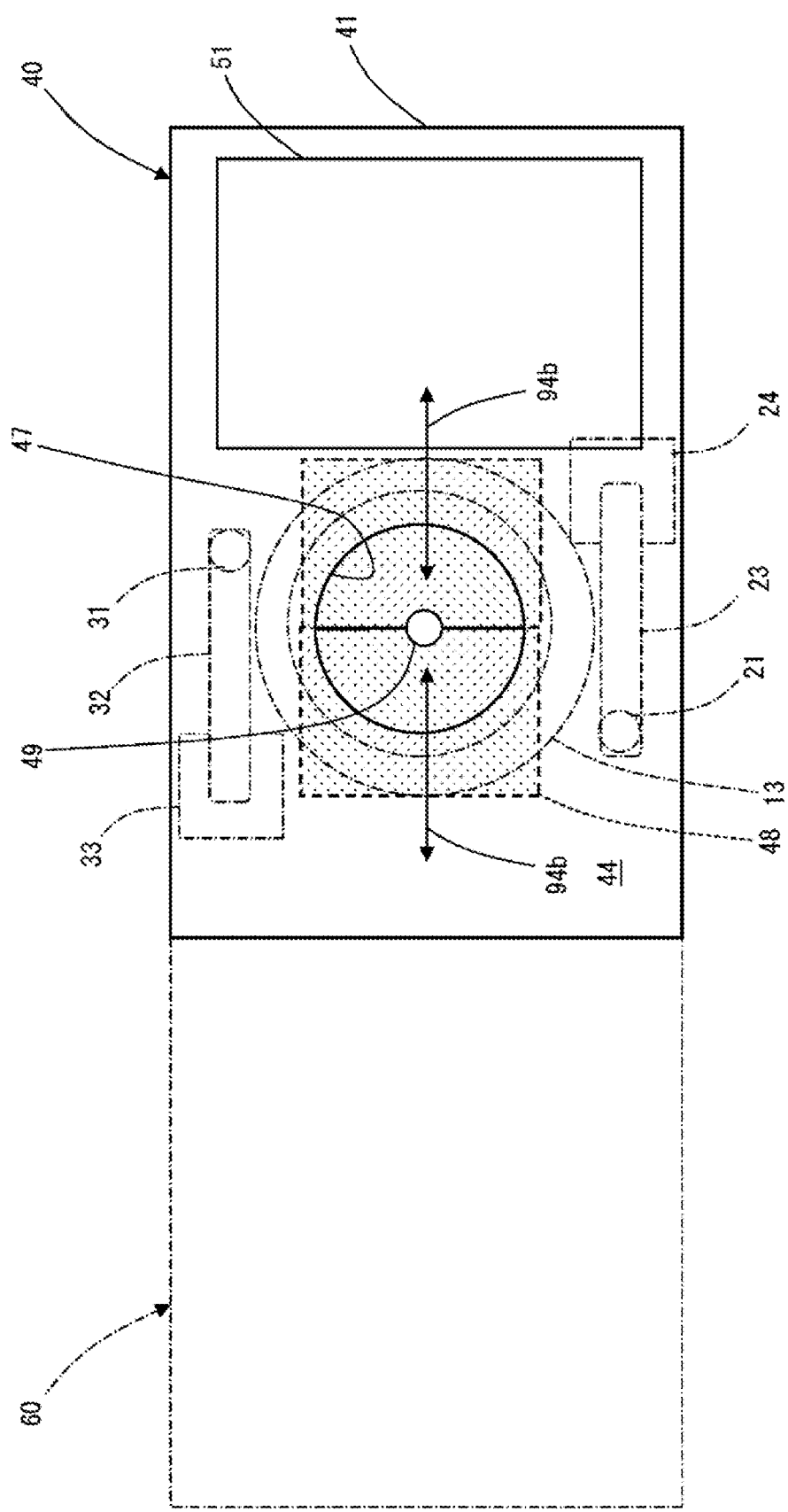
FIG. 2 is a plan view of the second floor of the wafer cleaning apparatus of the embodiment.

Hereinafter, a wafer cleaning apparatus 100 according to an embodiment will be described with reference to the drawings. As shown in FIGS. 1 and 2, the wafer cleaning apparatus 100 has a two-story structure with the first floor shown in FIG. 1 and the second floor shown in FIG. 2. As shown in FIG. 1, a wet cleaning unit 10 and a horizontal transport unit 60 are disposed adjacent to each other on the first floor. A dry cleaning unit 40 is disposed on the second floor to overlap the wet cleaning unit 10 on top of it.

Figure 3:
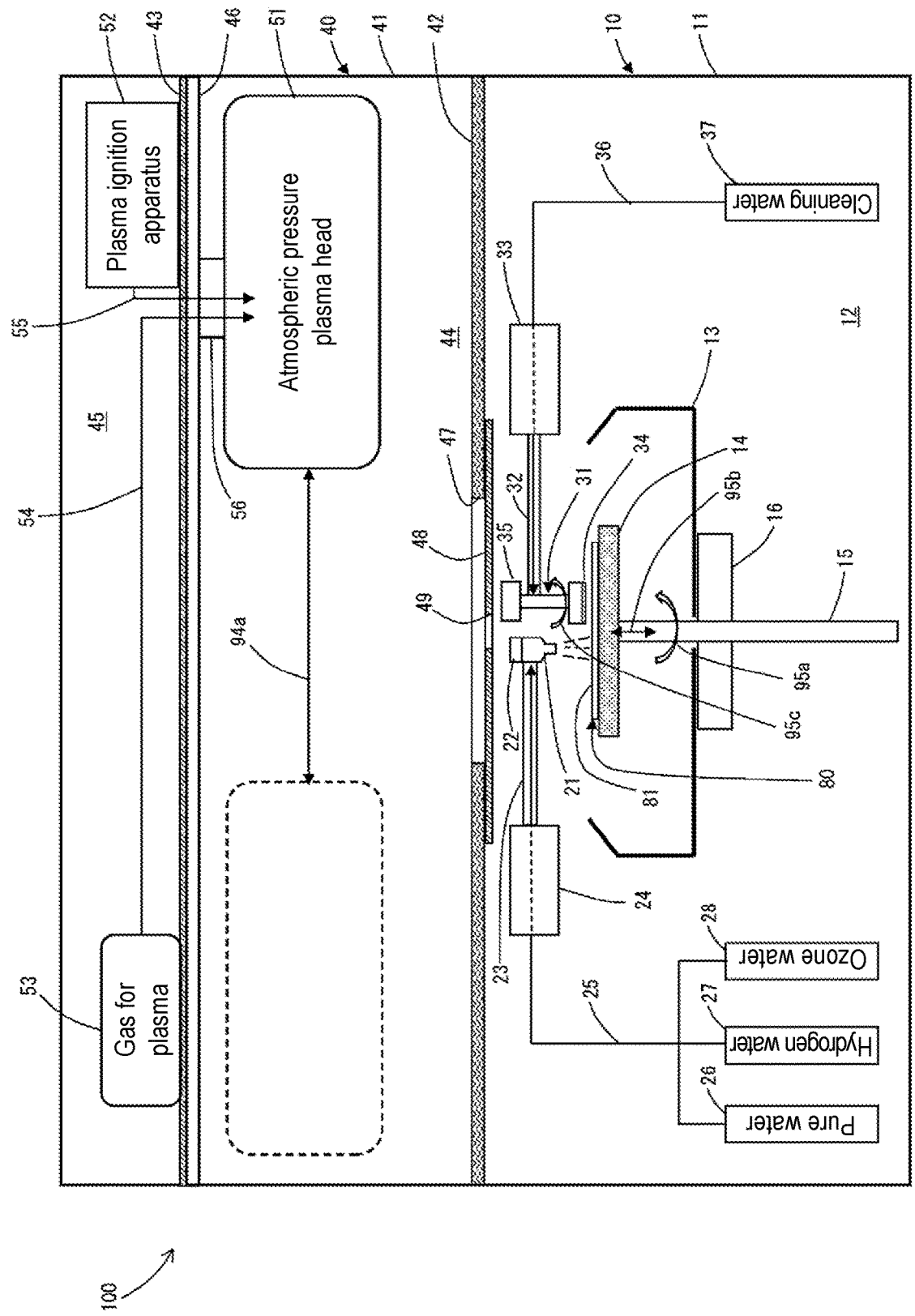
FIG. 3 is an elevation cross-sectional view of a wet cleaning unit and a dry cleaning unit of the wafer cleaning apparatus of the embodiment.

As shown in FIGS. 1 and 3, the wet cleaning unit 10 includes a casing 11 in a substantially rectangular parallelepiped shape, a wet cleaning chamber 13 located within the interior 12 of the casing 11, a processing stage 14, a drive apparatus 16 for driving the processing stage 14, a water nozzle 21, an ultrasonic vibrator 22, a nozzle arm 23, a nozzle arm drive part 24, a wiping head 31, a head arm 32, a head arm drive part 33, a rotary pressing drive part 35, a wiping member 34, a pure water tank 26, a hydrogen water tank 27, an ozone water tank 28 and a cleaning water tank 37.

The processing stage 14 is a disk-shaped member that holds a wafer 80 on its upper surface. A shaft 15 is connected to the lower side of the processing stage 14. The shaft 15 is rotationally driven by the drive apparatus 16 as indicated by an arrow 95a in FIG. 3 and driven in the up-down direction as indicated by an arrow 95b in FIG. 3. Therefore, the processing stage 14 is rotated and driven in the up-down direction by the drive apparatus 16 while holding the wafer 80.

The water nozzle 21 is disposed above the processing stage 14 and sprays pure water, ozone water, and hydrogen water onto the wafer 80 held on the upper surface of the processing stage 14. The water nozzle 21 is attached to the tip of the nozzle arm 23. A root part of the nozzle arm 23 is connected to the nozzle arm drive part 24. The nozzle arm drive part 24 rotates and moves the nozzle arm 23 within a plane as indicated by an arrow 91 in FIG. 1 to move the water nozzle 21 attached to the tip of the nozzle arm 23 into and out of the upper surface of the processing stage 14. The ultrasonic vibrator 22 is attached to the upper part of the water nozzle 21 to apply ultrasonic vibration to pure water, hydrogen water, and ozone water sprayed from the water nozzle 21.

The wiping head 31 is disposed above the processing stage 14, drives and rotates the wiping member 34 attached to the lower end by the rotary pressing drive part 35 attached to the upper end in the direction of an arrow 95c shown in FIG. 3, and brings the wiping member 34 into contact with the upper surface of the wafer 80 to wipe and clean the surface 81 of the wafer 80. The wiping member 34 may be a woven or knitted fabric using, for example, microfibers. Further, the wiping head 31 incorporates a cleaning water nozzle for spraying cleaning water toward the wafer 80.

The wiping head 31 is attached to the tip of the head arm 32. A root part of the head arm 32 is connected to the head arm drive part 33. The head arm drive part 33 rotates and moves the head arm 32 within a plane as indicated by an arrow 92 in FIG. 1 to move the wiping head 31 attached to the tip of the head arm 32 in and out of the upper surface of the processing stage 14.

The wet cleaning chamber 13 is provided below the processing stage 14, has a circular shape that receives pure water, ozone water, hydrogen water sprayed from the water nozzle 21, or cleaning water sprayed from the wiping head 31, and has a narrow opening towards the top. The upper opening has a size that allows the wafer 80 to be taken in and out.

The pure water tank 26, the hydrogen water tank 27, and the ozone water tank 28 are tanks that store pure water, hydrogen water, and ozone water, respectively. Here, hydrogen water is water in which hydrogen gas is dissolved, and ozone water is water in which ozone gas is dissolved. Instead of the hydrogen water tank 27 and the ozone water tank 28, a hydrogen water generator for generating hydrogen water and an ozone water generator for generating ozone water may be disposed. The cleaning water tank 37 stores cleaning water such as pure water, hydrogen water, alkali-added hydrogen water, carbonated water, and the like.

The pure water tank 26, the hydrogen water tank 27, and the ozone water tank 28 are connected to the water nozzle 21 by a pipe 25. Further, the cleaning water tank 37 is connected to the wiping head 31 by a pipe 36.

As shown in FIG. 1, a horizontal transport unit 60 is disposed adjacent to the wet cleaning unit 10 on the first floor. The horizontal transport unit 60 includes a casing 61, a wafer transfer stage 63 disposed in the interior 62 of the casing 61, a horizontal transport robot 64 as a horizontal transport apparatus, and a hand 65. The wafer transfer stage 63 is a stage that receives an uncleaned wafer 80 from the outside and delivers a cleaned wafer 80. A side wall 11a of the casing 11 of the wet cleaning unit 10 and a side wall 61a of the horizontal transport unit 60 are provided with an opening 66 for transporting the wafer 80 between the horizontal transport unit 60 and the wet cleaning unit 10. The horizontal transport robot 64 transports the wafer 80 between the wafer transfer stage 63 and the processing stage 14 of the wet cleaning unit 10 through the opening 66 as indicated by an arrow 93 in FIG. 1.

As shown in FIGS. 2 and 3, the dry cleaning unit 40 includes a casing 41 which is in a substantially rectangular parallelepiped shape and is disposed to overlap the casing 11 of the wet cleaning unit 10 on top of it, a floor plate 42, a ceiling plate 43, a ceiling rail 46, an atmospheric pressure plasma head 51, a plasma ignition apparatus 52, a plasma gas tank 53 and a plasma head drive part 56.

A space partitioned by the walls of the casing 41, the floor plate 42, and the ceiling plate 43 configures a dry cleaning chamber 44 in which dry cleaning processing is performed by the atmospheric pressure plasma sprayed from the atmospheric pressure plasma head 51. In addition, the space above the ceiling plate 43 configures an equipment installation space 45 into which the atmospheric pressure plasma does not enter.

The atmospheric pressure plasma head 51 may be, for example, an apparatus in which multiple plasma generators are disposed side by side, which includes a ceramic tube through which gas for plasma flows, a negative electrode disposed outside the ceramic tube, and a ground electrode disposed inside the ceramic tube, and in which a high voltage is applied between the negative electrode and the ground electrode to generate discharge in the ceramic tube and plasma is sprayed from the tip thereof. The atmospheric pressure plasma head 51 is attached to the ceiling rail 46 via the plasma head drive part 56. The plasma head drive part 56 reciprocally moves the atmospheric pressure plasma head 51 in the horizontal direction as indicated by an arrow 94a in FIG. 3.

Figure 6:
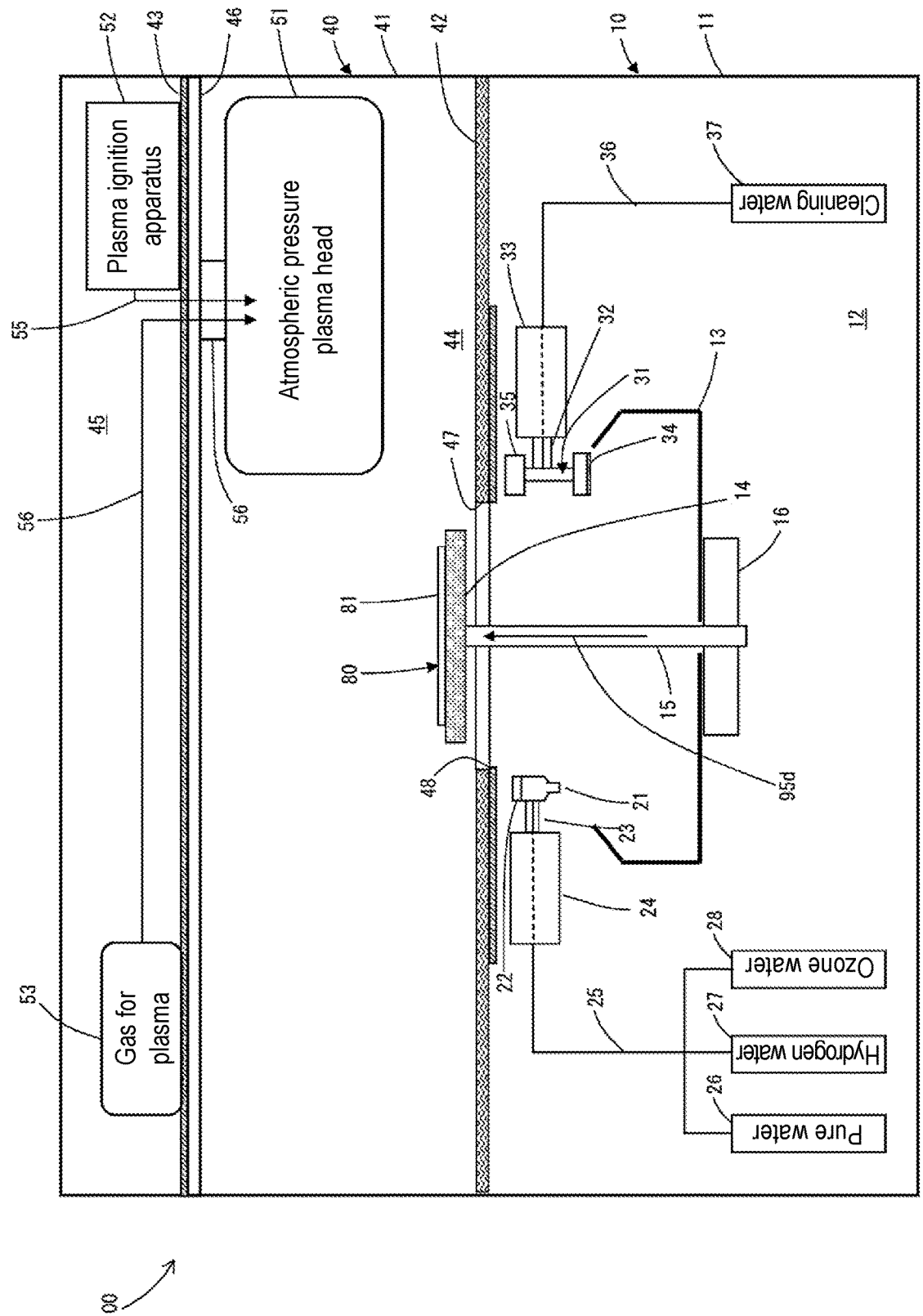
FIG. 6 is a view showing the operation of the wafer cleaning apparatus shown in FIG. 3, and is an elevation cross-sectional view showing a state in which the wafer is moved from the wet cleaning chamber to the dry cleaning chamber.

At the center of the floor plate 42 and above the processing stage 14 of the wet cleaning unit 10 disposed on the lower side, an opening 47 that allows the processing stage 14 to move in the up-down direction is provided. A shutter 48 for opening and closing the opening 47 is provided below the floor plate 42. The shutter 48 is slid by a drive part (not shown) as indicated by an arrow 94b in FIG. 2 to open and close the opening 47. When the shutter 48 is opened, as shown in FIG. 6, the processing stage 14 of the wet cleaning unit 10 may move upward as indicated by an arrow 95d from the wet cleaning chamber 13 into the dry cleaning chamber 44. The shutter 48 is closed after the processing stage 14 moves into the dry cleaning chamber 44. At this time, a semicircular notch 49 (see FIG. 2) is provided in the center of two mating surfaces of the shutter 48 to form an opening through which the shaft 15 may pass between the wet cleaning unit 10 and the dry cleaning unit 40.

The plasma ignition apparatus 52 is an apparatus that supplies a high voltage to electrodes disposed inside the atmospheric pressure plasma head 51, and is connected to the atmospheric pressure plasma head 51 by a connection line 55.

The plasma gas tank 53 is a tank that stores gas for plasma. As the gas for plasma, an inert gas such as argon, helium and the like may be used. The plasma gas tank 53 and the atmospheric pressure plasma head 51 are connected by a pipe 54.

Next, the cleaning operation of the wafer 80 in the wafer cleaning apparatus 100 will be described with reference to FIGS. 4 to 7.

Figure 4:
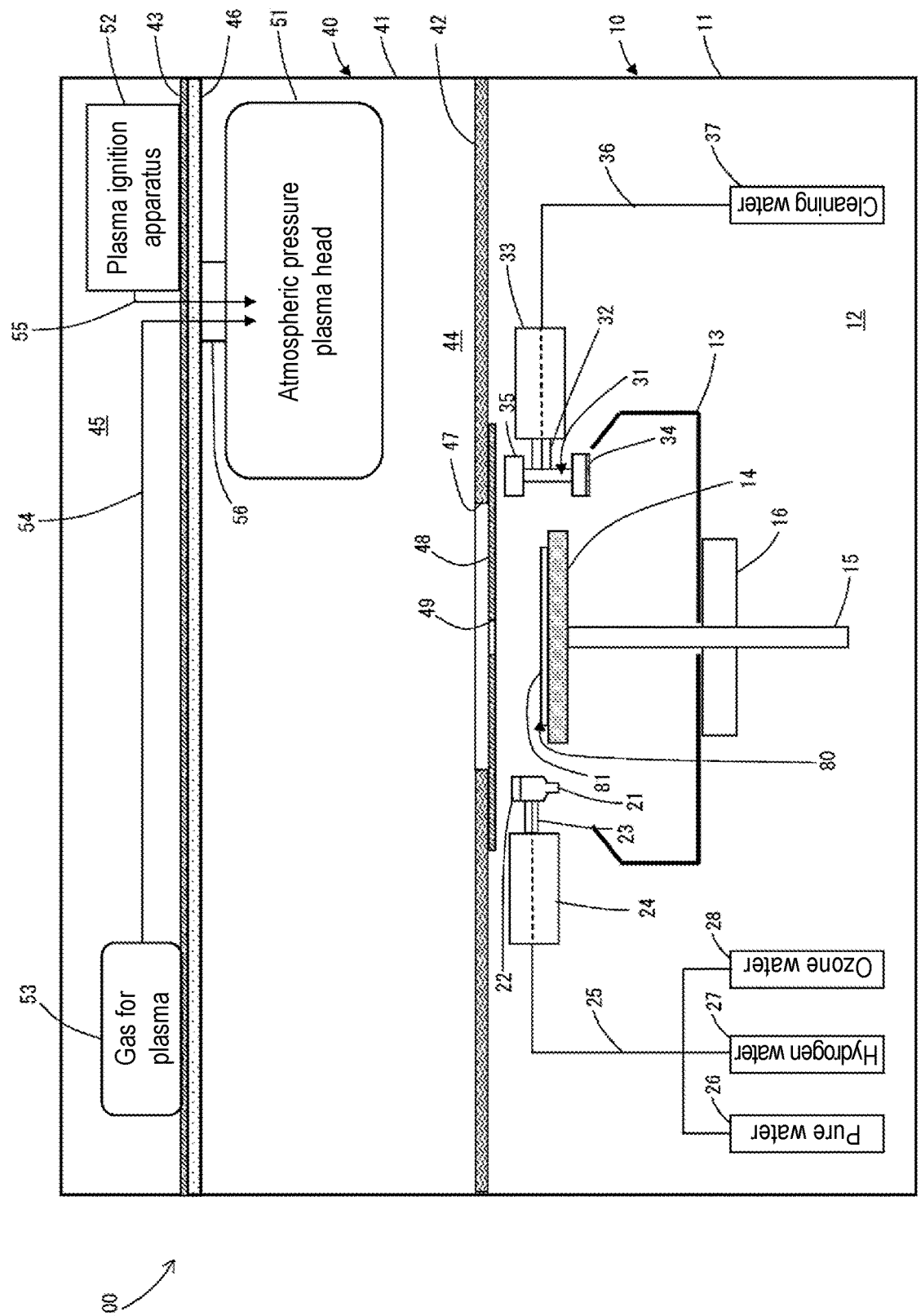
FIG. 4 is a view showing the operation of the wafer cleaning apparatus shown in FIG. 3, and is an elevation cross-sectional view showing a state in which a wafer is held on a processing stage.

As shown in FIG. 4, in the initial state, the shutter 48 is closed, and the wet cleaning unit 10 and the dry cleaning unit 40 are partitioned by the floor plate 42 and the shutter 48 of the casing 41 of the dry cleaning unit 40. Further, as shown in FIG. 1, the nozzle arm 23 and the head arm 32 retract the water nozzle 21 and the wiping head 31 to a position where they do not overlap the processing stage 14.

The horizontal transport robot 64 shown in FIG. 1 picks up the uncleaned wafer 80 placed on the wafer transfer stage 63 of the horizontal transport unit 60 and places it on the processing stage 14 of the wet cleaning unit 10 as shown in FIG. 4. The processing stage 14 holds the wafer 80 on its upper surface.

Figure 5:
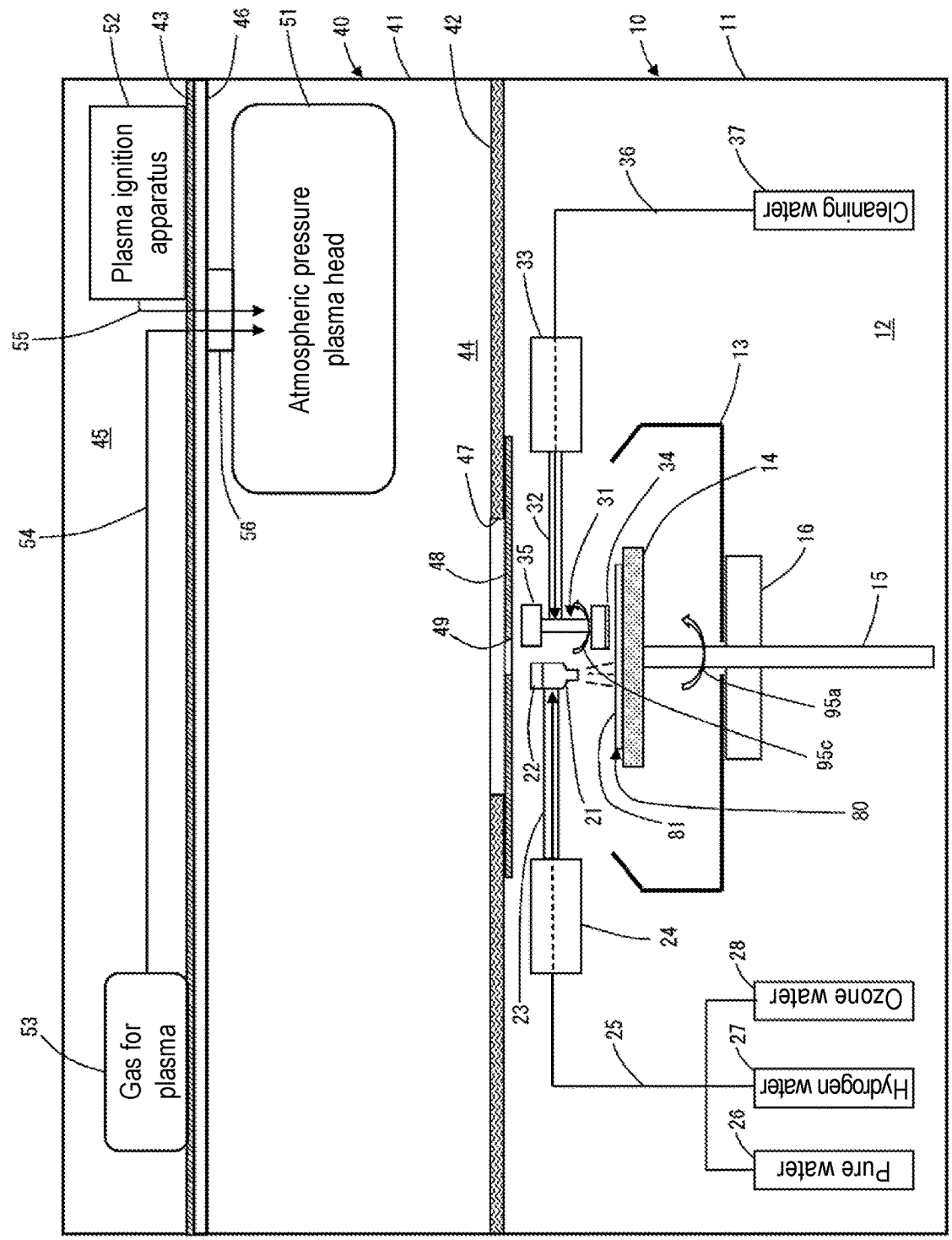
FIG. 5 is a view showing the operation of the wafer cleaning apparatus shown in FIG. 3, and is an elevation cross-sectional view during wet cleaning.

Next, as shown in FIG. 5, the wet cleaning unit 10 performs wet cleaning. As shown in FIG. 5, the nozzle arm drive part 24 rotates the nozzle arm 23 to move the water nozzle 21 above the processing stage 14. Then, the drive apparatus 16 rotates the processing stage 14, and the water nozzle 21 sprays pure water, hydrogen water, or ozone water toward the wafer 80 to clean the wafer 80. At this time, ultrasonic vibration may be applied to the pure water, hydrogen water, or ozone water by the ultrasonic vibrator 22. Next, the head arm drive part 33 rotates the head arm 32 to move the wiping head 31 above the processing stage 14. The rotary pressing drive part 35 of the wiping head 31 rotates and drives the wiping member 34 to contact the upper surface of the wafer 80 and move it along the surface 81 of the wafer 80 to wipe and clean the surface 81 of the wafer 80. At this time, the surface 81 of the wafer 80 may be wiped clean while cleaning water is being sprayed from the wiping head 31.

After the wet cleaning is completed, as shown in FIG. 6, the shutter 48 is opened, and the drive apparatus 16 moves the processing stage 14 upward as indicated by the arrow 95d in FIG. 6. The processing stage 14 is thereby moved into the dry cleaning chamber 44.

Figure 7:
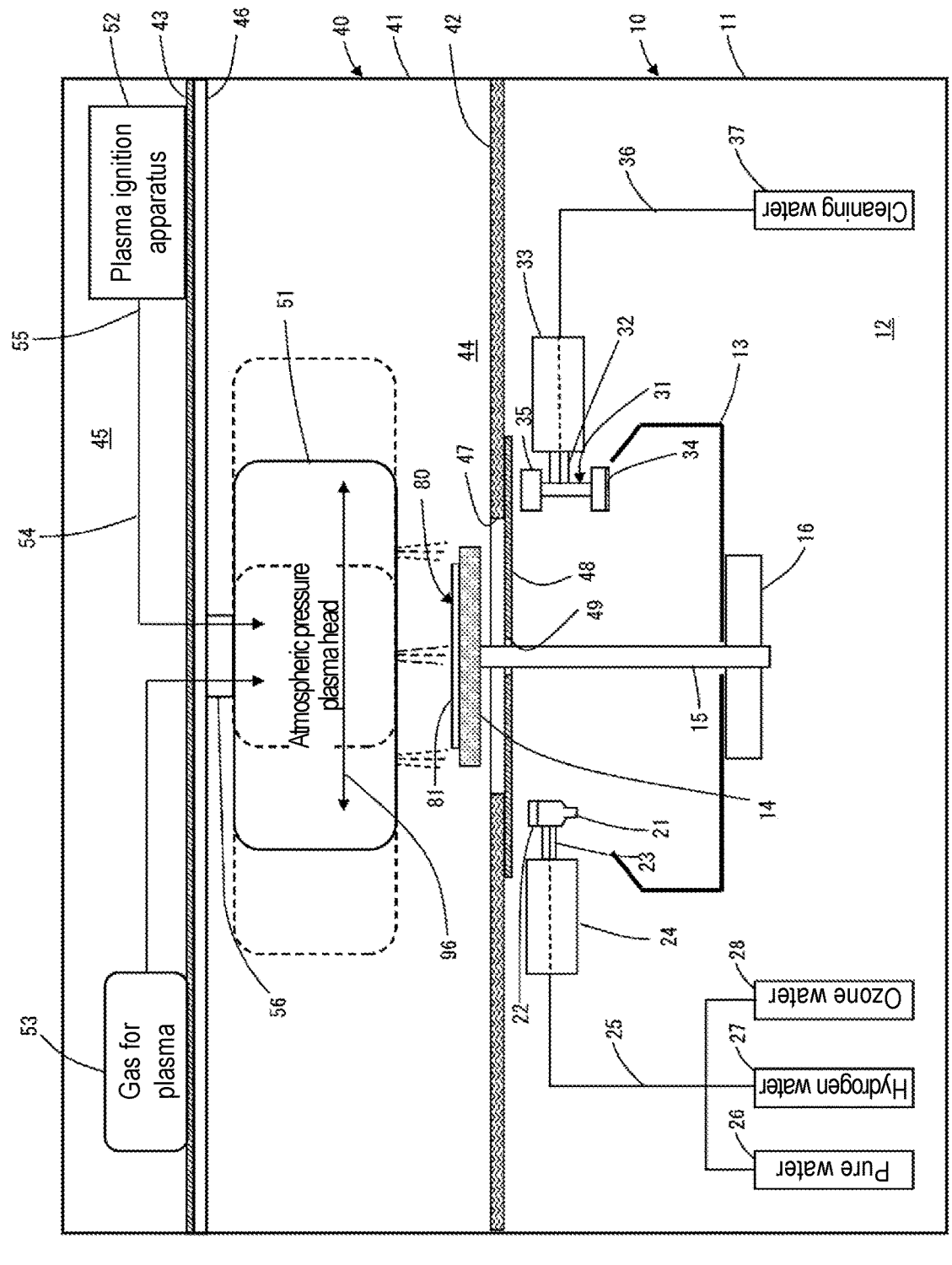
FIG. 7 is a view showing the operation of the wafer cleaning apparatus shown in FIG. 3, and is an elevation cross-sectional view during dry cleaning.

After the processing stage 14 is moved to the dry cleaning chamber 44, as shown in FIG. 7, the shutter 48 is closed, and the atmospheric pressure plasma head 51 is moved above the processing stage 14. Then, a high voltage is supplied from the plasma ignition apparatus 52 to the atmospheric pressure plasma head 51, and a plasma gas is supplied from the plasma gas tank 53 to the atmospheric pressure plasma head 51 to generate atmospheric pressure plasma, and dry cleaning is performed by reciprocally moving the atmospheric pressure plasma head 51 above the wafer 80 as indicated by an arrow 96 in FIG. 7.

When dry cleaning is performed, the dry cleaning chamber 44 is separated from the wet cleaning unit 10 by the shutter 48; therefore, it is possible to suppress the influence caused by atmospheric pressure plasma entering the interior 12 of the wet cleaning unit 10 and roughening the surfaces of the equipment disposed therein.

After the dry cleaning is completed, as shown in FIG. 6, the shutter 48 is released again to lower the processing stage 14 into the wet cleaning chamber 13, thus completing the cleaning operation of the wafer 80.

After the cleaning, the wafer 80 is transported onto the wafer transfer stage 63 of the horizontal transport unit 60 by the horizontal transport robot 64, and transported to the next process by another transport robot.

As described above, in the wafer cleaning apparatus 100 of the embodiment, by disposing the dry cleaning unit 40 to overlap the wet cleaning unit 10, the size and the installation area of the wafer cleaning apparatus 100 may be reduced.

Further, since the wafer 80 may be moved between the wet cleaning chamber 13 and the dry cleaning chamber 44 while being held on the upper surface of the processing stage 14, the time required for moving the wafer 80 between the wet cleaning chamber 13 and the dry cleaning chamber 44 may be shortened, and the processing speed of the cleaning process may be improved.

Further, during dry cleaning, the dry cleaning chamber 44 is separated from the wet cleaning unit 10 by the shutter 48; therefore, it is possible to suppress the atmospheric pressure plasma in the dry cleaning unit 40 from hitting the surface of each equipment disposed in the wet cleaning unit 10 and roughening of the surface of each equipment.

In the wafer cleaning apparatus 100 described above, the dry cleaning unit 40 is disposed to overlap the wet cleaning unit 10 on top of it, but for example, the dry cleaning unit 40 may be smaller than the wet cleaning unit 10, and the dry cleaning unit 40 may be disposed to partially overlap the wet cleaning unit 10.

Next, a wafer cleaning apparatus 200 of another embodiment will be described with reference to FIG. 8. The same parts as those of the wafer cleaning apparatus 100 described above with reference to FIGS. 1 to 7 are denoted by the same reference numerals, and the description thereof is omitted.

Figure 8:
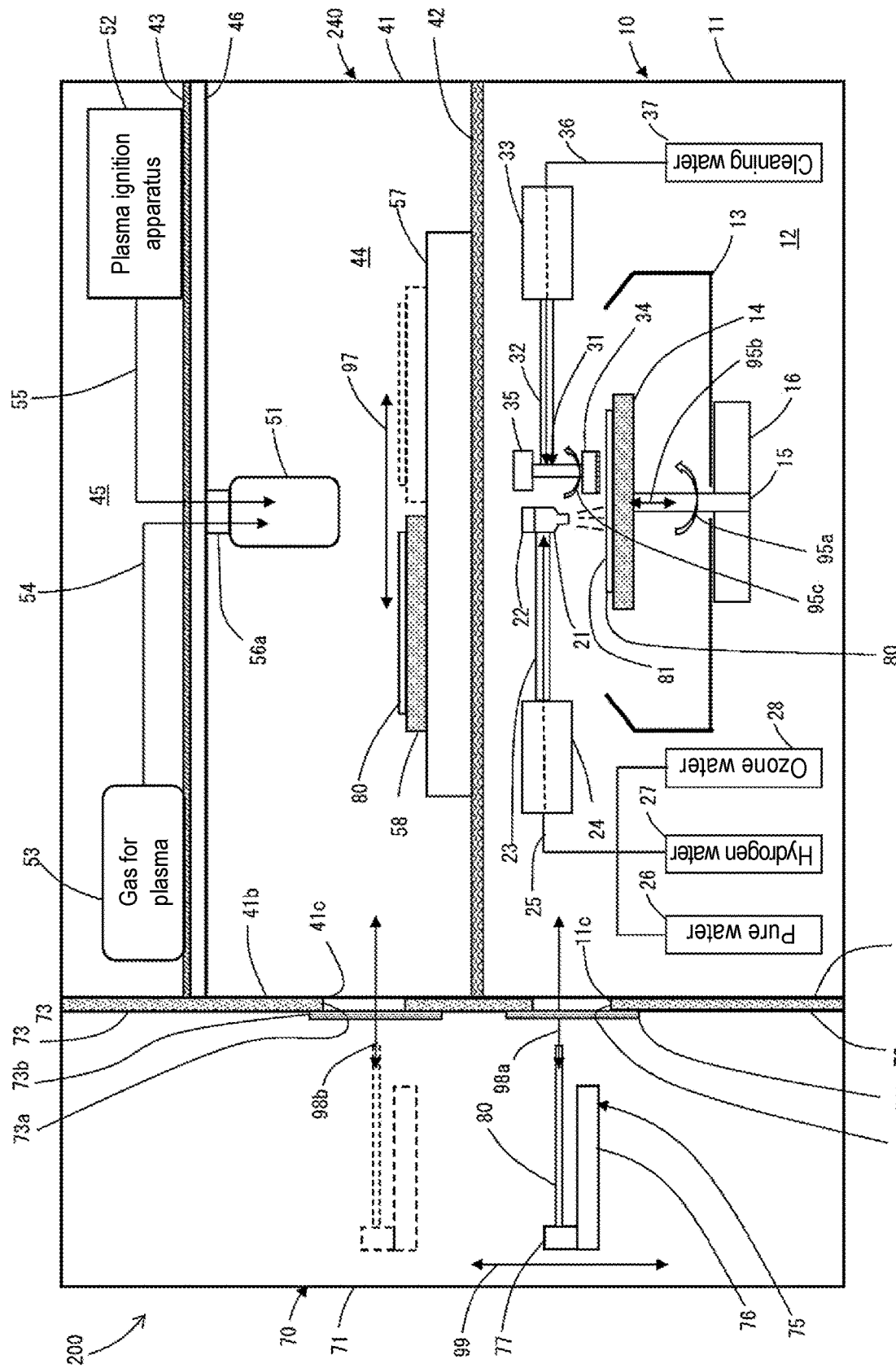
FIG. 8 is an elevation cross-sectional view of a wafer cleaning apparatus of another embodiment.

The wafer cleaning apparatus 200 shown in FIG. 8 includes a vertical transport unit 70 adjacent to side walls 11b and 41b of a wet cleaning unit 10 and a dry cleaning unit 240 which are disposed one above the other. The vertical transport unit 70 transports the wafer 80 between the wet cleaning chamber 13 and the dry cleaning chamber 44.

The vertical transport unit 70 includes a casing 71 and a vertical transport apparatus 75 disposed inside the casing 71.

The casing 71 is a substantially rectangular parallelepiped member which is disposed adjacent to the side surfaces of the wet cleaning unit 10 and the dry cleaning unit 240 and which extends in the up-down direction across the wet cleaning unit 10 and the dry cleaning unit 240. A first-floor side wall 72 of the casing 71 is provided with an opening 72a that communicates with an opening 11c of the side wall 11b of the casing 11 of the wet cleaning unit 10. Similarly, a second-floor side wall 73 is provided with an opening 73a that communicates with an opening 41c of the side wall 41b of the casing 41 of the dry cleaning unit 240. Shutters 72b and 73b are attached to the openings 72a and 73a, respectively.

The vertical transport apparatus 75 is disposed inside the casing 71 to move the wafer 80 into and out of the wet cleaning chamber 13 and the dry cleaning chamber 44, and to transport the wafer 80 between the wet cleaning chamber 13 and the dry cleaning chamber 44.

As shown in FIG. 8, the vertical transport apparatus 75 includes a main body 76 that moves in the up-down direction as indicated by an arrow 99 in FIG. 8, and a chuck 77 that is mounted on the main body 76 and slides in the horizontal direction. The chuck 77 grips the wafer 80 and reciprocally moves in the horizontal direction as indicated by arrows 98a and 98b shown in FIG. 8.

The wet cleaning unit 10 has the same configuration as the wet cleaning unit 10 of the wafer cleaning apparatus 100 described above with reference FIGS. 1 to 7 except that the side wall 11b of the casing 11 is provided with the opening 11c.

The dry cleaning unit 240 includes a processing stage 58 that holds the wafer 80 inside the dry cleaning chamber 44, and a slide drive part 57 that reciprocally moves the processing stage 58 in the direction of an arrow 97 shown in FIG. 8. The atmospheric pressure plasma head 51 is attached to the ceiling rail 46 with a bracket 56a, and unlike the dry cleaning unit 40 described above with reference to FIGS. 1 to 7, the atmospheric pressure plasma head 51 does not move reciprocally. Further, the side wall 41b of the casing 41 is provided with the opening 41c.

The wafer cleaning apparatus 200 configured as described above performs wet cleaning of the wafer 80 in the wet cleaning unit 10, and when the wet cleaning is completed, the shutters 72b and 73b are opened and the vertical transport apparatus 75 moves the wafer 80 to the dry cleaning unit 240. After the movement of the wafer 80 is completed, the shutters 72b and 73b are closed, and the processing stage 58 holding the wafer 80 on its upper surface is reciprocally moved by the slide drive part 57 to perform dry cleaning. After the dry cleaning is completed, the shutters 72b and 73b are opened, and the wafer 80 is transported to the wet cleaning unit 10 by the vertical transport apparatus 75, and the cleaning operation of the wafer 80 is completed.

As described above, in the wafer cleaning apparatus 200 of the embodiment, like the wafer cleaning apparatus 100 of the embodiment, by disposing the dry cleaning unit 240 to overlap the wet cleaning unit 10, the size and the installation area of the wafer cleaning apparatus 200 may be reduced.

Next, a bonding system 300 of an embodiment will be described with reference to FIGS. 9 and 10.

Figure 9:
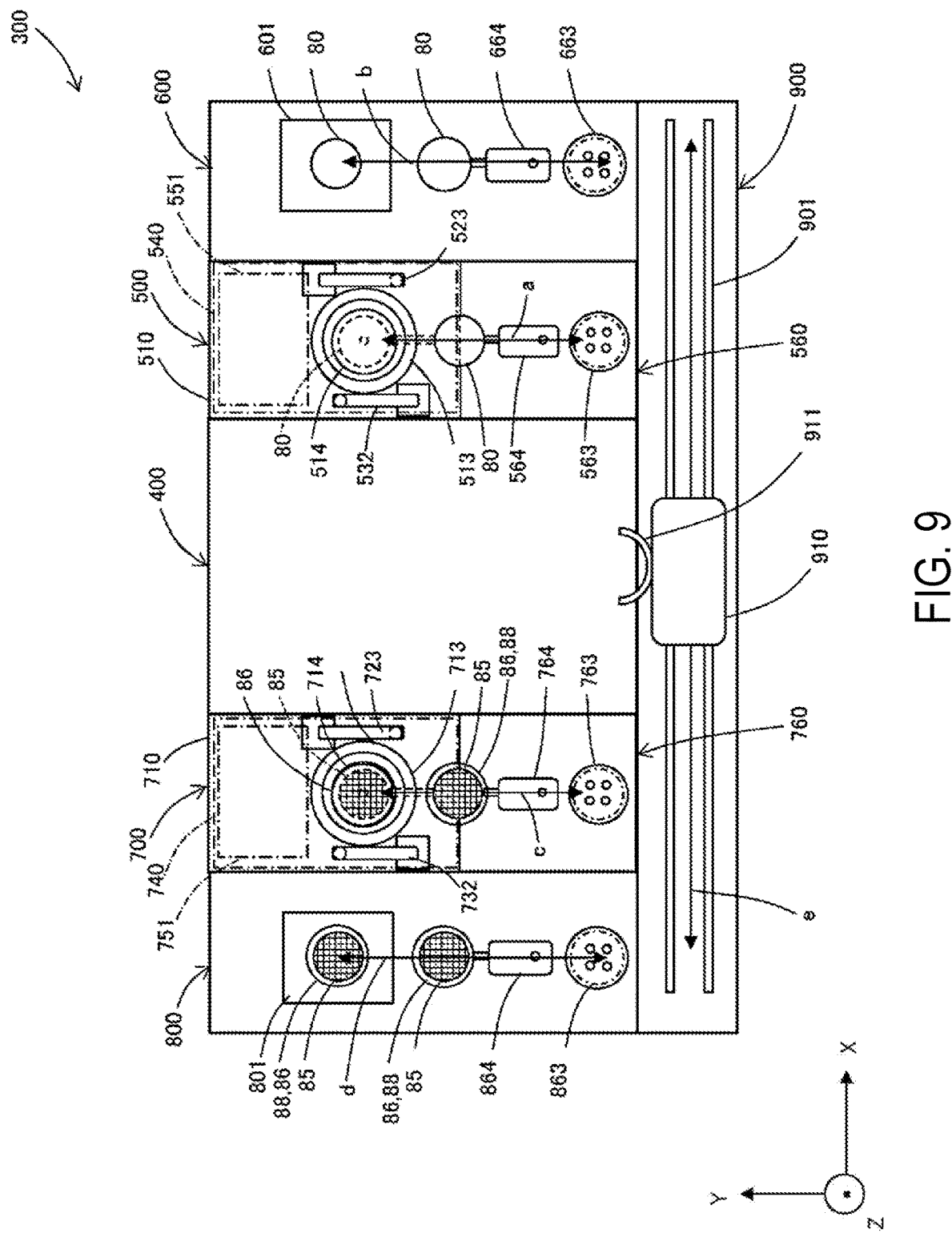
FIG. 9 is a plan view showing the first floor of the bonding system of the embodiment.

As shown in FIG. 9, the bonding system 300 of the embodiment includes a bonding apparatus 400, a first cleaning apparatus 500, a wafer supply apparatus 600, a second cleaning apparatus 700, a semiconductor chip supply apparatus 800, and a transport apparatus 900. In the following description, the direction in which the transport apparatus 900 extends is the X direction; the direction perpendicular to the X direction on the horizontal plane is the Y direction; and the vertical direction is the Z direction.

As shown in FIG. 9, the first cleaning apparatus 500 and the second cleaning apparatus 700 are disposed adjacent to the bonding apparatus 400 on the positive and negative sides in the X direction, respectively. The wafer supply apparatus 600 is disposed adjacent to the first cleaning apparatus 500 on the positive side in the X direction, and the semiconductor chip supply apparatus 800 is disposed adjacent to the second cleaning apparatus 700 on the negative side in the X direction. The transport apparatus 900 extending in the X direction across the bonding apparatus 400, the first cleaning apparatus 500, the wafer supply apparatus 600, the second cleaning apparatus 700, and the semiconductor chip supply apparatus 800 is disposed on the negative side in the Y direction of the bonding apparatus 400, the first cleaning apparatus 500, the wafer supply apparatus 600, the second cleaning apparatus 700, and the semiconductor chip supply apparatus 800.

Figure 11:
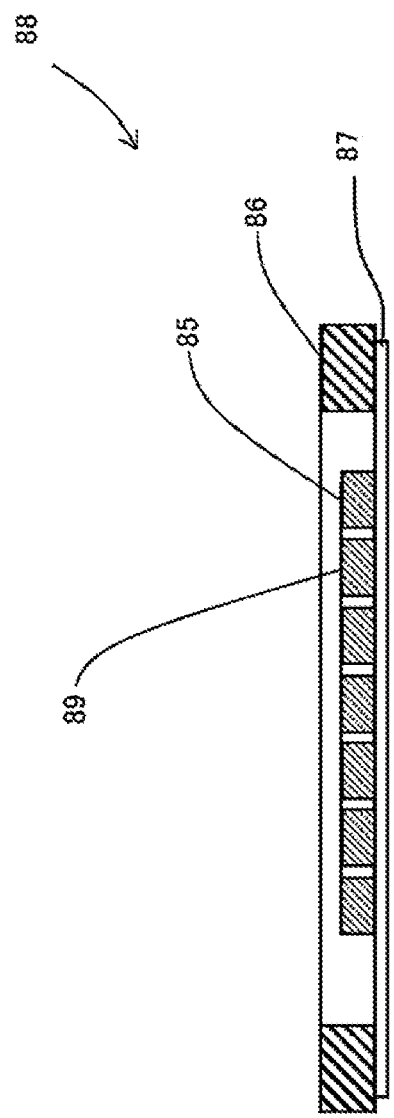
FIG. 11 is a cross-sectional view showing a semiconductor chip attached on a dicing film and a ring attached with the dicing film.

The bonding apparatus 400 is an apparatus for bonding a semiconductor chip 85 onto a wafer 80. Here, as shown in FIG. 11, the semiconductor chip 85 is obtained by attaching a dicing film 87 made of silicon as a support material to the lower surface of the disk-shaped wafer 80 and cutting the wafer 80 from the upper side with a dicing saw in a grid pattern. Further, the upper surface of the outer circumference of the dicing film 87 is attached to a ring 86. Therefore, the semiconductor chip 85 is handled together with the ring 86 while being attached to the upper surface of the dicing film 87. In the following description, an assembly of the ring 86, the dicing film 87 and the semiconductor chip 85 that are handled together will be referred to as an assembly 88. The reference numeral 89 shown in FIG. 11 indicates the surface 89 of the semiconductor chip 85. In this embodiment, the semiconductor chip 85 is attached on the dicing film 87. However, it is not limited thereto, and the semiconductor chip 85 may be attached on a silicon wafer, a glass plate, or a substrate.

With reference back to FIG. 9, the bonding apparatus 400 picks up the semiconductor chip 85 from the dicing film 87 and bonds it onto the wafer 80. Further, the bonding apparatus 400 picks up the semiconductor chip 85 from the dicing film 87, bonds another semiconductor chip 85 onto the semiconductor chip 85 bonded to the upper surface of the wafer 80, and bonds semiconductor chips 85 onto the wafer 80 in multiple stages.

As shown in FIG. 9, the first cleaning apparatus 500 is disposed adjacent to the bonding apparatus 400 on the positive side in the X direction. The first cleaning apparatus 500 is an apparatus for cleaning the surface of the wafer 80 or the semiconductor chip 85 attached to the upper surface of the dicing film 87 as shown in FIG. 2. The first cleaning apparatus 500 has the same structure as the wafer cleaning apparatus 100 described above with reference to FIGS. 1 to 7, and includes a first floor on which a wet cleaning unit 510 and a horizontal transport unit 560 are disposed adjacent to each other, and a second floor on which a dry cleaning unit 540 is disposed to overlap the wet cleaning unit 510 on top of it.

As shown in FIG. 9, the wet cleaning unit 510 includes a wet cleaning chamber 513, a processing stage 514, a nozzle arm 523, and a head arm 532, like the wet cleaning unit 10 of the wafer cleaning apparatus 100 described above. Though not shown, like the wet cleaning unit 10 described above, the wet cleaning unit 510 includes a drive apparatus 16, a water nozzle 21, an ultrasonic vibrator 22, a nozzle arm drive part 24, a wiping head 31, a head arm drive part 33, a rotary pressing drive part 35, a wiping member 34, a pure water tank 26, a hydrogen water tank 27, an ozone water tank 28 and a cleaning water tank 37.

Figure 10:
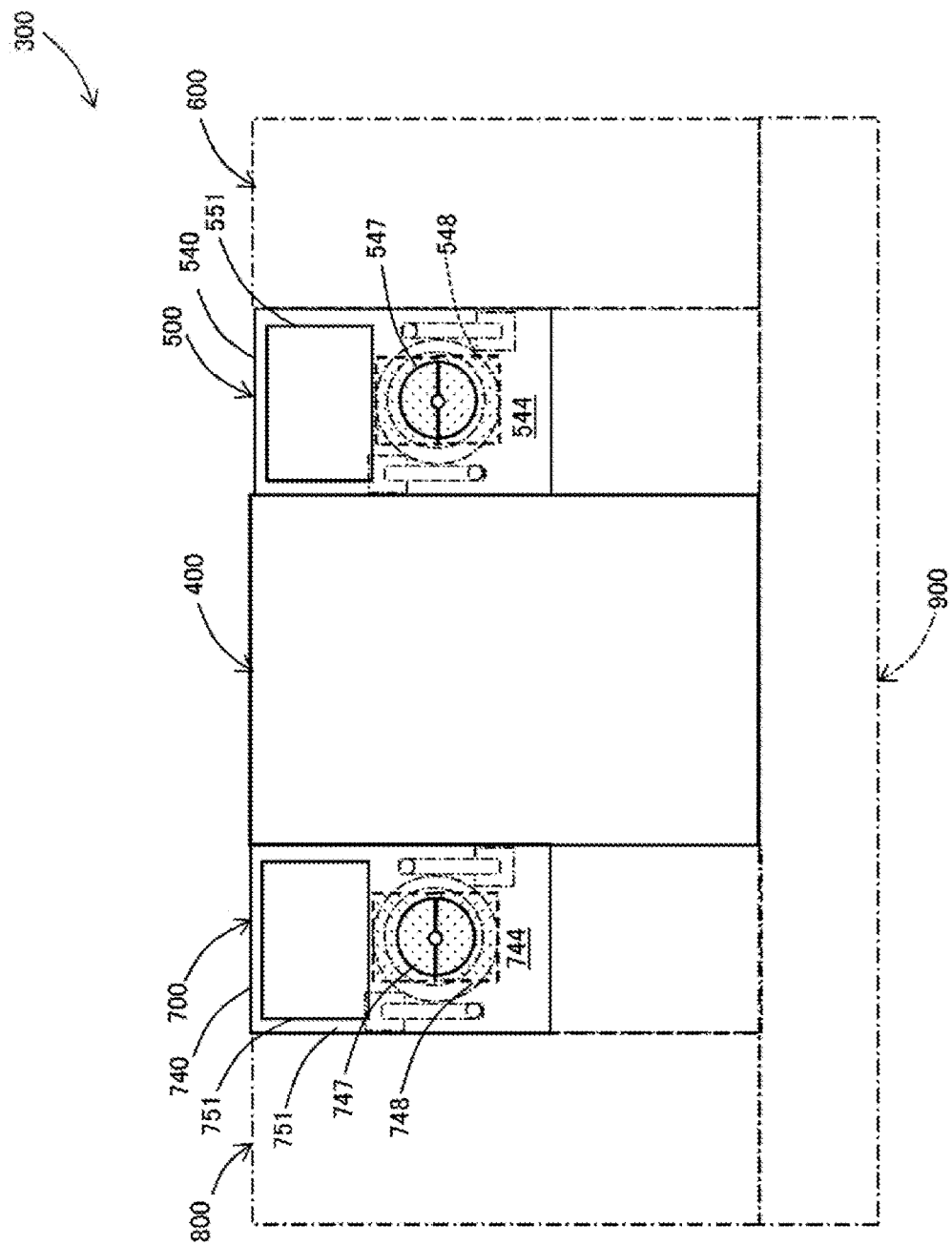
FIG. 10 is a plan view showing the second floor of the bonding system shown in FIG. 9.

As shown in FIG. 10, like the dry cleaning unit 40 of the wafer cleaning apparatus 100 described above with reference to FIGS. 1 to 7, the dry cleaning unit 540 includes an atmospheric pressure plasma head 551, a dry cleaning chamber 544 and a shutter 548 that opens and closes an opening 547 in the floor plate 542. When the shutter 548 is opened and closed, the processing stage 514 of the wet cleaning unit 510 may move upward from the wet cleaning chamber 513 into the dry cleaning chamber 544. Though not shown, the dry cleaning unit 540 includes a plasma ignition apparatus 52 and a plasma gas tank 53, like the dry cleaning unit 40 described above.

With reference back to FIG. 9, the horizontal transport unit 560, like the horizontal transport unit 60 described with reference to FIGS. 1 to 7, includes a transfer stage 563 and a horizontal transport robot 564 which is a horizontal transport apparatus. The horizontal transport robot 564 transports the wafer 80 between the transfer stage 563 and the processing stage 514 of the wet cleaning unit 510 as indicated by an arrow a in FIG. 10.

As shown in FIG. 9, the wafer supply apparatus 600 includes a stocker 601 for stocking an uncleaned wafer 80, a transfer stage 663, and a horizontal transport robot 664 for transporting the wafer 80 between the stocker 601 and the transfer stage 663 as indicated by an arrow b.

As shown in FIG. 9, the second cleaning apparatus 700 is disposed adjacent to the bonding apparatus 400 on the negative side in the X direction. Since the second cleaning apparatus 700 has the same structure as the first cleaning apparatus 500 described above, the corresponding parts are denoted by reference numerals in the 700 series and the description thereof is omitted.

As shown in FIG. 9, the semiconductor chip supply apparatus 800 includes a stocker 801 for stocking an uncleaned semiconductor chip 85, a transfer stage 863, and a horizontal transport robot 864 for transporting the assembly 88 between the stocker 801 and the transfer stage 863 as indicated by an arrow d. The stocker 801 stocks the assembly 88 of the ring 86, the dicing film 87 and the semiconductor chip 85.

As shown in FIG. 9, the transport apparatus 900 includes a rail 901 extending in the X direction, and a transport robot 910 moving on the rail 901 in the X direction as indicated by an arrow e. The transport robot 910 includes an arm 911 that holds the wafer 80 or the assembly 88 of the ring 86, the dicing film 87 and the semiconductor chip 85. The transport robot 910 holds the wafer 80 or the assembly 88 of the ring 86, the dicing film 87, and the semiconductor chip 85 with the arm 911; transfers the wafer 80 or the assembly 88 of the ring 86, the dicing film 87, and the semiconductor chip 85 between the transfer stages 563, 663, 763, and 863; and transports the wafer 80 or the assembly 88 of the ring 86, the dicing film 87, and the semiconductor chip 85 in the X direction.

The insides of the bonding apparatus 400, the first cleaning apparatus 500, the wafer supply apparatus 600, the second cleaning apparatus 700, the semiconductor chip supply apparatus 800, and the transport apparatus 900 described above are maintained at an air cleanliness level equivalent to that of a clean room in which semiconductor devices are manufactured.

Next, the process of bonding the semiconductor chip 85 onto the wafer 80 by the bonding system 300 configured as described above will be described.

The horizontal transport robot 664 of the wafer supply apparatus 600 takes out an uncleaned wafer 80 from the stocker 601, transports it to the transfer stage 663, and places the wafer 80 on the transfer stage 663.

The transport robot 910 of the transport apparatus 900 picks up the wafer 80 from the transfer stage 663 with the arm 911, transports it toward the negative side in the X direction, and places it on the transfer stage 563 of the horizontal transport unit 560 of the first cleaning apparatus 500.

The horizontal transport robot 564 of the first cleaning apparatus 500 picks up the wafer 80 from the transfer stage 563, transports it to the processing stage 514 of the wet cleaning unit 510, and, as shown in FIG. 4, places the wafer 80 on the processing stage 514.

As described above with reference to FIGS. 5 to 7, the wet cleaning unit 510 and the dry cleaning unit 540 of the first cleaning apparatus 500 wet clean the surface 81 of the wafer 80 by the wet cleaning unit 510 and irradiates the surface 81 of the wafer 80 with atmospheric pressure plasma to clean the surface 81 of the wafer 80 by the dry cleaning unit 540.

The horizontal transport robot 564 of the first cleaning apparatus 500 picks up the cleaned wafer 80 from the processing stage 514 and transports it to the transfer stage 563.

The transport robot 910 of the transport apparatus 900 picks up the wafer 80 from the transfer stage 563 of the first cleaning apparatus 500 with the arm 911, transports it toward the negative side in the X direction, and places it at a predetermined position on the bonding apparatus 400.

The horizontal transport robot 864 of the semiconductor chip supply apparatus 800 takes out an uncleaned assembly 88 from the stocker 801, transports it to the transfer stage 863, and places the assembly 88 on the transfer stage 863.

The transport robot 910 of the transport apparatus 900 picks up the assembly 88 from the transfer stage 863 with the arm 911, transports it toward the positive side in the X direction, and places it on the transfer stage 763 of the horizontal transport unit 760 of the second cleaning apparatus 700.

The horizontal transport robot 764 of the second cleaning apparatus 700 picks up the assembly 88 from the transfer stage 763, transports it to the processing stage 714 provided in a wet cleaning chamber 713 of the wet cleaning unit 710, and places the assembly 88 on the processing stage 714. The wet cleaning unit 710 includes a nozzle arm 723 and a head arm 732.

As described above with reference to FIGS. 5 to 7, the wet cleaning unit 710 and the dry cleaning unit 740 of the second cleaning apparatus 700 wet clean the surface 89 of the semiconductor chip 85 attached to the upper surface of the dicing film 87 by the wet cleaning unit 510 and irradiates the surface 89 of the semiconductor chip 85 with atmospheric pressure plasma to clean the surface 89 of the semiconductor chip 85 by the dry cleaning unit 740. The dry cleaning unit 740 includes a dry cleaning chamber 744, an opening 747, a shutter 748 and an atmospheric pressure plasma head 751.

The horizontal transport robot 764 of the second cleaning apparatus 700 picks up the assembly 88 including the cleaned semiconductor chip 85 from the processing stage 714 and transports it to the transfer stage 763.

The transport robot 910 of the transport apparatus 900 picks up the assembly 88 from the transfer stage 763 of the second cleaning apparatus 700 with the arm 911, transports it toward the positive side in the X direction, and places it at a predetermined position on the bonding apparatus 400.

The bonding apparatus 88 picks up the semiconductor chip 85 from the dicing film 87 of the assembly 88 and bonds it to a predetermined position on the wafer 80.

The process of bonding the semiconductor chip 85 onto the wafer 80 by the bonding system 300 has been described above; however, the bonding system 300 may further bond another semiconductor chip 85 onto the semiconductor chip 85 bonded onto the wafer 80. At this time, the wafer 80 to which the semiconductor chip 85 is bonded is transported to the first cleaning apparatus 500 by the transport apparatus 900 and the horizontal transport unit 560 of the first cleaning apparatus 500, and the surface 89 of the semiconductor chip 85 is wet-cleaned and dry-cleaned. After cleaning, the wafer 80 to which the semiconductor chip 85 is bonded is placed at a predetermined position on the bonding apparatus 400 by the transport apparatus 900 and the horizontal transport unit 560 of the first cleaning apparatus 500. Then, the bonding apparatus 400 picks up another semiconductor chip 85 from the dicing film 87, and bonds another semiconductor chip 85 onto the semiconductor chip 85 already bonded to the upper surface of the wafer 80.

As described above, the insides of the bonding apparatus 400, the first cleaning apparatus 500, the wafer supply apparatus 600, the second cleaning apparatus 700, the semiconductor chip supply apparatus 800, and the transport apparatus 900 are maintained at an air cleanliness level equivalent to that of a clean room in which semiconductor devices are manufactured. Therefore, since the bonding system 300 may perform bonding without transporting the cleaned wafer 80 or semiconductor chip 85 to the outside of the bonding system 300, the bonding quality may be improved. In particular, when bonding the semiconductor chips 85 in multiple stages onto the wafer 80, the wafer 80 with the semiconductor chips 85 bonded thereto is cleaned without being carried outside, and the semiconductor chips 85 of the next stage may be bonded thereon; therefore, the bonding quality may be improved.

In the above description, the first cleaning apparatus 500 cleans the surface 81 of the wafer 80, and the second cleaning apparatus 700 cleans the surface 89 of the semiconductor chip 85. However, they are not limited thereto, and the semiconductor chip 85 may be cleaned by the first cleaning apparatus 500, and the wafer 80 may be cleaned by the second cleaning apparatus 700.

In the bonding system 300 described above, the first cleaning apparatus 500 and the second cleaning apparatus 700 have the same configuration as the wafer cleaning apparatus 100 described with reference to FIGS. 1 to 7, but they are not limited thereto.

For example, the first cleaning apparatus 500 and the second cleaning apparatus 700 may have the same configuration as the wafer cleaning apparatus 200 described with reference to FIG. 8.

In this case, the first cleaning apparatus 500 and the second cleaning apparatus 700, like the wafer cleaning apparatus 200 as shown in FIG. 8, includes a wet cleaning unit 10 with a wet cleaning chamber 13, a dry cleaning unit 240 with a dry cleaning chamber 44, and a vertical transport unit 70 disposed adjacent to the side surfaces of the wet cleaning unit 10 and the dry cleaning unit 240 and extending in the up-down direction across the wet cleaning unit 10 and the dry cleaning unit 240.

The vertical transport unit 70 includes the vertical transport apparatus 75 that moves the wafer 80 or the semiconductor chip 85 into and out of the wet cleaning chamber 13 and the dry cleaning chamber 44 and transports the wafer 80 or the semiconductor chip 85 between the wet cleaning chamber 13 and the dry cleaning chamber 44. The transport apparatus 900 transfers the wafer 80 or assembly 88 to and from the vertical transport apparatus 75.

In this configuration as well, bonding may be performed without transporting the cleaned wafer 80 or the semiconductor chip 85 to the outside, like the bonding system 300 described above; therefore, the bonding quality may be improved.

What is claimed is:

1. A wafer cleaning apparatus for cleaning a surface of a wafer, comprising:
   a wet cleaning unit that cleans the surface of the wafer with liquid, wherein the wet cleaning unit comprises a wet cleaning chamber and a water nozzle for performing wet cleaning; and
   a dry cleaning unit that cleans the surface of the wafer with atmospheric pressure plasma, wherein the dry cleaning unit comprises a dry cleaning chamber and a plasma head for performing dry cleaning,
   wherein the dry cleaning unit is disposed above the wet cleaning unit to overlap at least a part of the wet cleaning unit.

2. The wafer cleaning apparatus according to claim 1, further comprising:
   a processing stage that holds the wafer on its upper surface and is driven in an up-down direction while holding the wafer,
   wherein the processing stage moves the wafer in the up-down direction between the wet cleaning chamber and the dry cleaning chamber.

3. The wafer cleaning apparatus according to claim 2, further comprising:
   a shutter separating the wet cleaning unit and the dry cleaning unit.

4. The wafer cleaning apparatus according to claim 2, further comprising:

a horizontal transport unit disposed adjacent to the wet cleaning unit, the horizontal transport unit comprises a horizontal transport robot for moving the wafer into and out of the wet cleaning chamber.

5. The wafer cleaning apparatus according to claim 2, wherein the wet cleaning unit comprises:

the water nozzle for spraying hydrogen water, ozone water, or pure water onto the surface of the wafer; and a wiping head that moves a wiping fabric attached to its tip along the surface of the wafer to wipe the surface of the wafer, wherein the processing stage rotates while holding the wafer to rotate the wafer in the wet cleaning chamber.

6. The wafer cleaning apparatus according to claim 1, wherein the wafer cleaning apparatus further comprises a vertical transport unit that is disposed adjacent to side surfaces of the wet cleaning unit and the dry cleaning unit and extends in an up-down direction across the wet cleaning unit and the dry cleaning unit, and the vertical transport unit comprises a vertical transport apparatus that moves the wafer into and out of the wet cleaning chamber and the dry cleaning chamber and transports the wafer between the wet cleaning chamber and the dry cleaning chamber, wherein the vertical transport apparatus comprises a chuck.

7. The wafer cleaning apparatus according to claim 6, wherein the wet cleaning unit comprises:

the water nozzle for spraying hydrogen water, ozone water, or pure water onto the surface of the wafer;

a wiping head that moves a wiping fabric attached to its tip along the surface of the wafer to wipe the surface of the wafer; and a processing stage that holds the wafer on its upper surface and is rotated and driven in the up-down direction while holding the wafer.

8. A bonding system comprising:

a bonding apparatus for bonding a semiconductor chip onto a wafer, wherein the bonding apparatus comprises a bonding head;

a cleaning apparatus for cleaning a surface of the wafer or a surface of the semiconductor chip; and a transport apparatus for transporting the wafer or the semiconductor chip, wherein the transport apparatus comprises a transport robot, wherein the cleaning apparatus comprises:

a wet cleaning unit that cleans the surface of the wafer or the surface of the semiconductor chip with liquid, wherein the wet cleaning unit comprises a wet cleaning chamber and a water nozzle for performing wet cleaning; and a dry cleaning unit that cleans the surface of the wafer or the surface of the semiconductor chip with atmospheric pressure plasma, wherein the dry cleaning unit comprises a dry cleaning chamber and a plasma head for performing dry cleaning, wherein the dry cleaning unit is disposed above the wet cleaning unit to overlap at least a part of the wet cleaning unit, the transport apparatus moves the wafer or the semiconductor chip into and out of the cleaning apparatus, and transports the wafer or the semiconductor chip after cleaning from the cleaning apparatus to the bonding apparatus, and the bonding apparatus bonds the semiconductor chip after cleaning onto the wafer after cleaning.

9. The bonding system according to claim 8, wherein the cleaning apparatus comprises a processing stage that holds the wafer or the semiconductor chip on its upper surface and is driven in an up-down direction while holding the wafer or the semiconductor chip, and the processing stage moves the wafer or the semiconductor chip in the up-down direction between the wet cleaning chamber and the dry cleaning chamber.

10. The bonding system according to claim 9, wherein the cleaning apparatus further comprises a shutter separating the wet cleaning unit and the dry cleaning unit.

11. The bonding system according to claim 9, wherein the cleaning apparatus further comprises a horizontal transport unit disposed adjacent to the wet cleaning unit, the horizontal transport unit comprises a horizontal transport robot for moving the wafer or the semiconductor chip into and out of the wet cleaning chamber, and the transport apparatus transfers the wafer or the semiconductor chip to and from the horizontal transport robot.

12. The bonding system according to claim 8, wherein the bonding system further comprises a vertical transport unit that is disposed adjacent to side surfaces of the wet cleaning unit and the dry cleaning unit and extends in an up-down direction across the wet cleaning unit and the dry cleaning unit, the vertical transport unit comprises a vertical transport apparatus that moves the wafer or the semiconductor chip into and out of the wet cleaning chamber and the dry cleaning chamber and transports the wafer or the semiconductor chip between the wet cleaning chamber and the dry cleaning chamber, wherein the vertical transport apparatus comprises a chuck, and the transport apparatus transfers the wafer or the semiconductor chip to and from the vertical transport apparatus.

13. The bonding system according to claim 8, wherein the semiconductor chip is attached to an upper surface of a support material, the cleaning apparatus cleans the surface of the semiconductor chip attached to the upper surface of the support material, the transport apparatus transports the semiconductor chip attached to the upper surface of the support material together with the support material, and the bonding apparatus picks up the semiconductor chip from the support material and bonds it onto the wafer.

14. The bonding system according to claim 13, wherein the cleaning apparatus cleans the surface of the semiconductor chip bonded to the upper surface of the wafer, the transport apparatus transports the wafer with the semiconductor chip bonded to its upper surface, and the bonding apparatus picks up another semiconductor chip from the support material and bonds the another semiconductor chip onto the semiconductor chip already bonded to the upper surface of the wafer.

15. The bonding system according to claim 13, wherein the support material is a dicing film, a silicon wafer, a glass plate, or a substrate.

* * * * *